US009282676B1

(12) United States Patent
Diaz (10) Patent No.: US 9,282,676 B1
(45) Date of Patent: Mar. 8, 2016

(54) SUSPENDED ELECTRONIC DISPLAY AND COOLING ASSEMBLY

(71) Applicant: Manufacturing Resources International, Inc., Alpharetta, GA (US)

(72) Inventor: Marcos Diaz, Alpharetta, GA (US)

(73) Assignee: MANUFACTURING RESOURCES INTERNATIONAL, INC., Alpharetta, GA (US)

( * ) Notice: Subject to any disclaimer, the term of this patent is extended or adjusted under 35 U.S.C. 154(b) by 1 day.

(21) Appl. No.: 14/553,086

(22) Filed: Nov. 25, 2014

(51) Int. Cl.
*H05K 7/20* (2006.01)
*H05K 5/00* (2006.01)
*H05K 7/18* (2006.01)

(52) U.S. Cl.
CPC .......... *H05K 7/20145* (2013.01); *H05K 5/0017* (2013.01); *H05K 7/18* (2013.01)

(58) Field of Classification Search
CPC ....... H05K 7/20; H05K 7/20972; H05K 5/00; H05K 5/02; G06F 1/20; G06F 1/1601; G06F 1/333; G06F 9/00; G09F 13/04; H04H 5/64; F16M 13/02
USPC .......... 361/679.01, 679.46–679.51, 690, 692, 361/694, 695; 165/121–126, 185; 312/223.1, 223.2; 349/1, 56, 58, 72, 349/161; 454/184; 248/27.3, 229.1, 283.1, 248/317, 323, 226.11
See application file for complete search history.

(56) References Cited

U.S. PATENT DOCUMENTS

| | | | | |
|---|---|---|---|---|
| 3,984,931 | A * | 10/1976 | Belokin, Jr. ............... | G09F 7/08 40/559 |
| 7,768,775 | B2 * | 8/2010 | Kim ......................... | H05K 5/02 248/284.1 |
| 8,300,203 | B2 * | 10/2012 | Nakamichi ............. | G06F 1/1601 349/161 |
| 8,400,608 | B2 * | 3/2013 | Takahashi ............. | H05K 7/20972 349/161 |
| 8,472,191 | B2 * | 6/2013 | Yamamoto ............ | H05K 7/20963 165/104.33 |
| 8,804,091 | B2 * | 8/2014 | Dunn ...................... | G02F 1/133385 349/161 |
| 9,119,330 | B2 * | 8/2015 | Hubbard ............... | G02F 1/13308 |
| 9,235,232 | B2 * | 1/2016 | King ....................... | G06F 1/1601 |
| 2009/0135365 | A1 * | 5/2009 | Dunn ...................... | H05K 7/20972 349/161 |
| 2009/0278007 | A1 * | 11/2009 | Taylor .................... | F16M 13/02 248/222.13 |
| 2011/0051071 | A1 * | 3/2011 | Nakamichi ............ | G06F 1/1601 349/161 |

* cited by examiner

Primary Examiner — Michail V Datskovskiy
(74) Attorney, Agent, or Firm — Standley Law Group LLP (57) ABSTRACT

An electronic display assembly for suspending an electronic display from one or more elongate members is disclosed. A closed loop of circulating fluid, such as air, may be placed within a sealed electronics compartment. An open loop channel may permit fluid, such as ambient air, to pass through the assembly via a channel defined by the space between the back pan and the electronic display. A pair of passageways preferably extend vertically along the assembly and are configured to accommodate the passage of an elongate member. Clamps may be utilized within these passageways to secure the assembly to the elongate members.

20 Claims, 14 Drawing Sheets

SUSPENDED ELECTRONIC DISPLAY AND COOLING ASSEMBLY

TECHNICAL FIELD

Embodiments of the present invention generally relate to mounting and cooling systems for electronic displays.

BACKGROUND

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures.

SUMMARY OF THE INVENTIVE CONCEPT

Exemplary embodiments may comprise two separate flow paths for a fluid, such as air, through an electronic display. A first flow path may be a closed loop and a second flow path may be an open loop. The closed loop path circulating in a sealed electronics compartment defined by the back pan, a perimeter wall, and a rear cover. The closed loop may further circulate around and through partitions placed within the sealed electronics compartment. The second flow path may be an open loop defined by a channel between the back pan and the electronic display. The open loop may be configured to draw ambient gas (e.g. ambient air) through the display assembly and be exhausted out the display housing. Both the open and closed flow path may contain fans for moving the air.

Exemplary embodiments further comprise passageways configured to accomodate elongate members that extend through the housing. The passageways may be placed outside of the sealed electronics compartment and further comprise at least one clamp placed within each passageway. The clamps may be configured to accomodate the elongate members and suspend the assembly from a support, such as from a frame.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
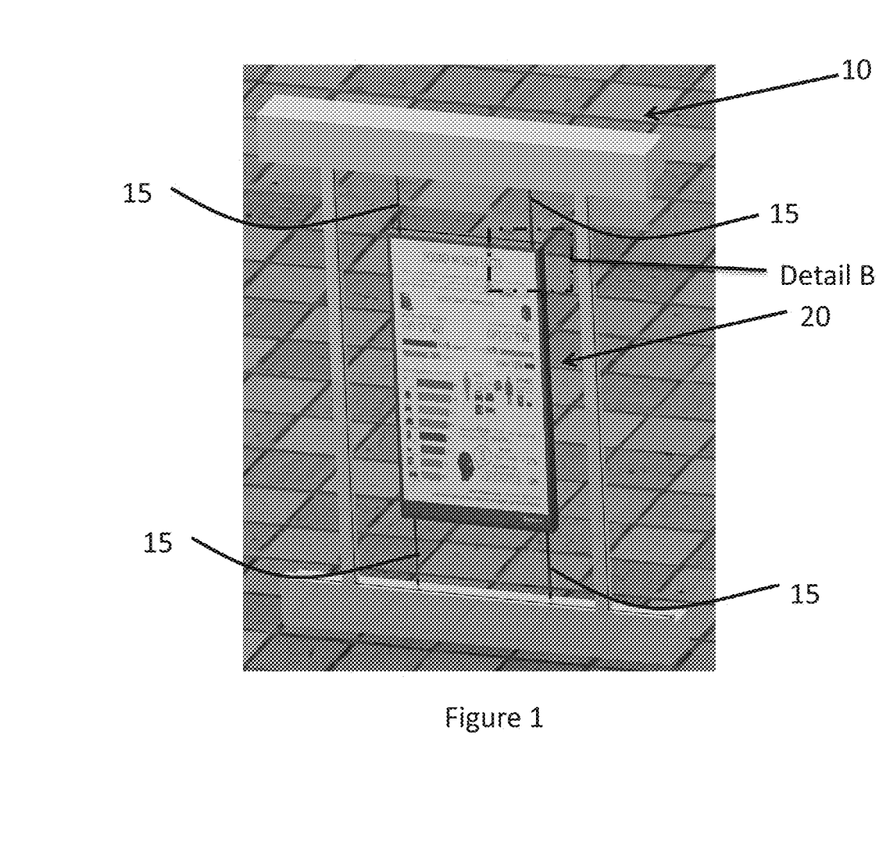
FIG. 1 is a front perspective view of the electronic display assembly housed in a frame and showing the locations of Detail B.
Figure 2:
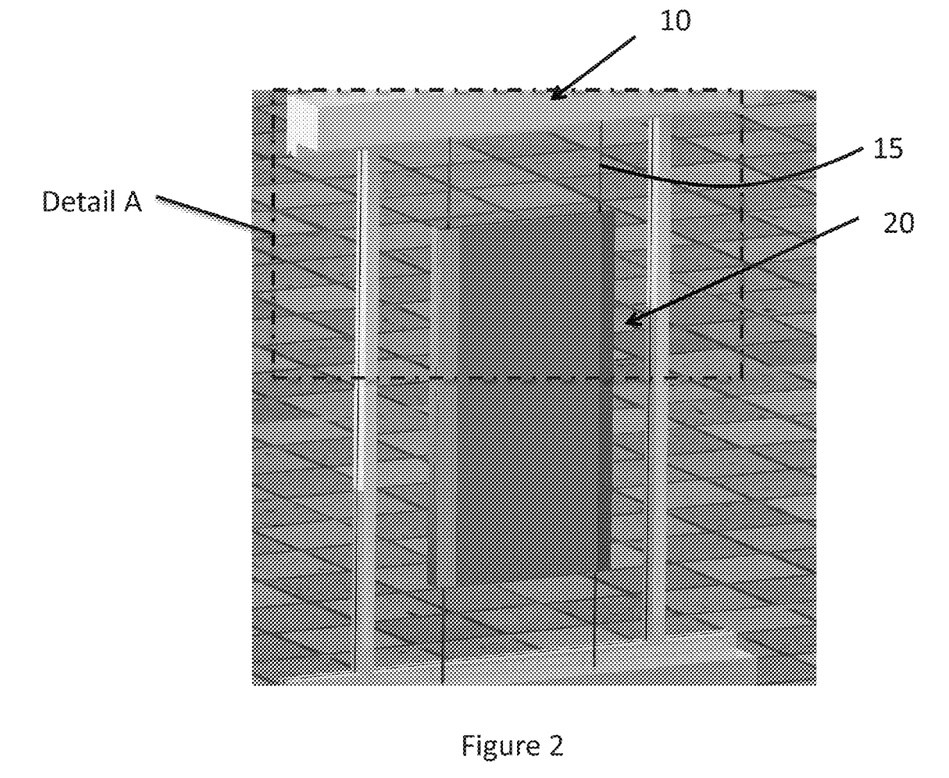
FIG. 2 is a rear perspective view of the electronic display assembly of FIG. 1 and showing the location of Detail A.
Figure 3:
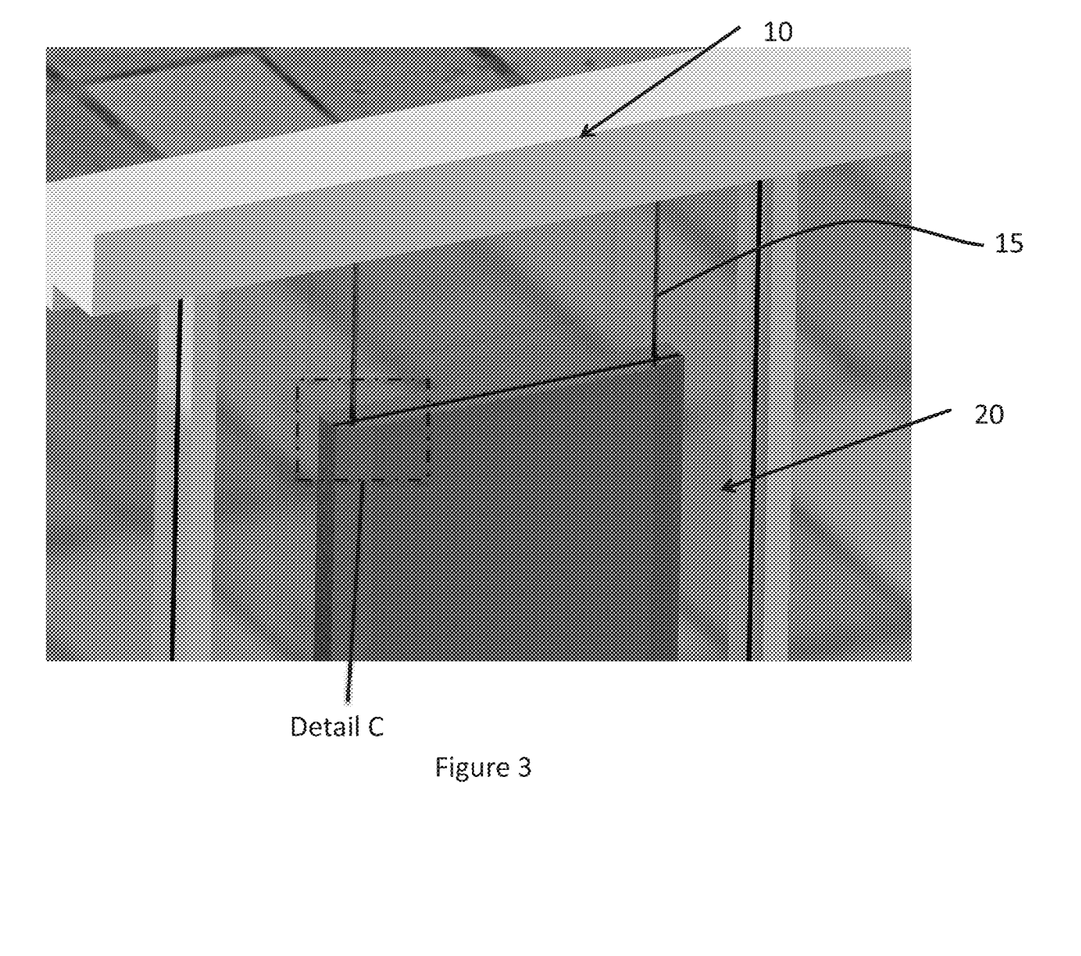
FIG. 3 is a detailed perspective view of Detail A shown in FIG. 2 and showing the location of Detail C.

FIG. 1 is a front perspective view of the electronic display assembly housed in a frame and showing the locations of Detail B. In an exemplary embodiment, an electronic display assembly 20 may be suspended from an upper support 10. The electronic display assembly 20 is preferably suspended from the upper support 10 by one or more elongate members 15. The upper support 10 may be configured such that the electronic display assembly 20 is suspended at or near a window. The electronic display assembly 20 may display information such as advertisements, marketing materials, directions, weather, maps, or other consumer media. The upper support 10 may be any fixture of the environment that is capable of supporting the weight of the electronic display assembly 20. In an exemplary embodiment, the upper support 10 may comprise a beam or ceiling joist that is oriented substantially horizontal and above the floor. In some embodiments, the upper support 10 may comprise a beam placed in the roof or ceiling or may be a free standing structure.

Figure 4:
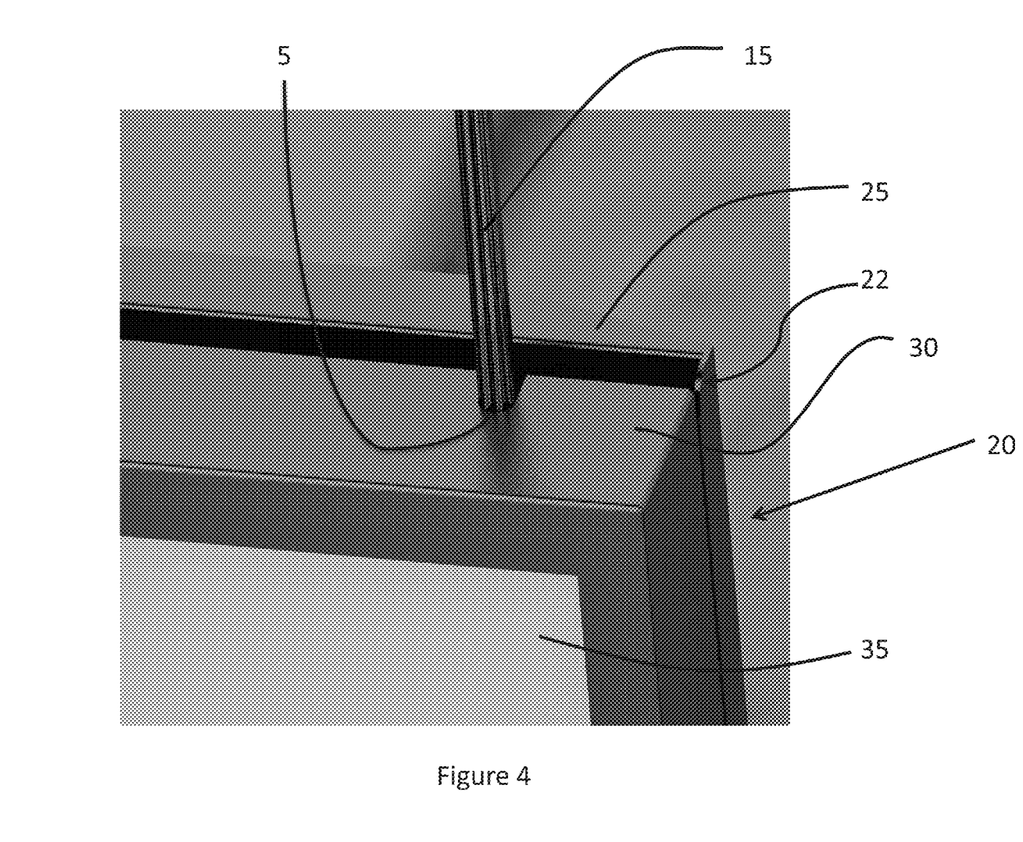
FIG. 4 is a detailed perspective view of Detail B shown in FIG. 1.

FIG. 4 is a detailed perspective view of Detail B shown in FIG. 1. The electronic display assembly 20 may be comprised of a front cover 30 and a rear cover 25. The front cover 30 may frame the display 35 and extend around at least a portion of the exterior sides of the assembly. The front cover may further comprise a slot 5 configured to accommodate the passage of elongate member 15. Elongate member 15 may be secured within the electronic display assembly 20. Rear cover 25 may be configured to extend over substantially the entire rear exterior and a portion of select exterior sides of the electronic display assembly 20. The front cover 30 and rear cover 25 are preferably configured to be assembled such that together they substantially surround and protect the electronic display 35 and related internal components while permitting the viewing of the display 35. Further, the front cover 30 and rear cover 25 may be configured to provide an aperture 22 running substantially the length of the top and bottom exterior sides of the electronic display assembly 20. The aperture 22 may be configured to permit the flow of the open loop fluid. In an exemplary embodiment, this open loop fluid is ambient air.

Figure 5:
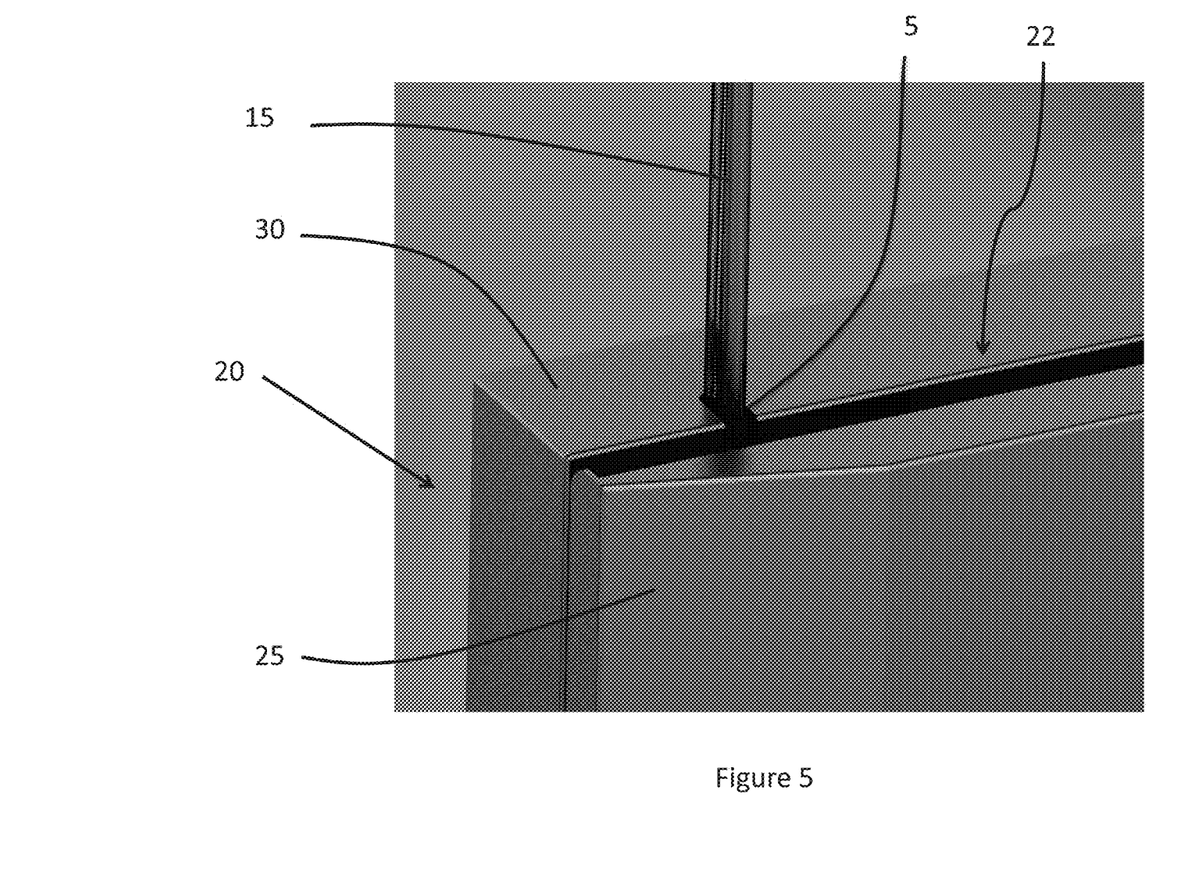
FIG. 5 is a detailed perspective view of Detail C shown in FIG. 3.

FIG. 5 illustrates a rear view of the device of FIG. 4. The elongate member 15 extends through front cover 30 via an accommodating slot 5.

Figure 6:
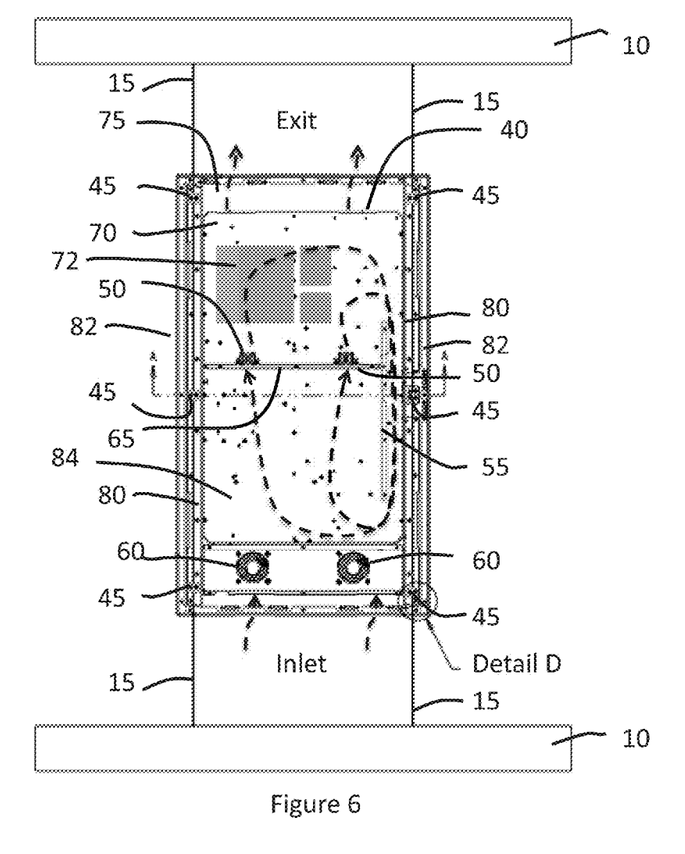
FIG. 6 is a rear planar view of the assembly of FIG. 1, illustrated with the rear cover removed and showing the location of section line A-A as well as Detail D.

FIG. 6 is a rear planar view of the assembly of FIG. 1, illustrated with the rear cover removed and showing the location of section line A-A as well as Detail D. This view illustrates some of the inner components of the assembly. The electronic display assembly 20 may be suspended from upper support 10 by at least one elongate member 15. These elongate members 15 preferably extend though the electronic display assembly 20 in passageways defined by the space between side walls 80 and exterior walls 82, and are secured therein, such as by clamps 45. This embodiment illustrates two elongate members 15, but other embodiments of the invention may contain any number of elongate members 15. Further, any number of clamps 45 are also contemplated.

From this view, a back pan 70 can be seen located behind a backlight 75. The rear cover 25, such as of FIG. 5, is not shown in the present figure in order to illustrate the interior components of this embodiment, however, rear cover 25 is generally placed behind the back pan 70 and atop a compartment side wall 80. The space between back pan 70, rear cover 25, and side wall 80 may define a sealed compartment 84 that comprises a closed loop for circulating fluid. The interior space may be defined by a side wall 80 which is placed around a perimeter of the back pan 70. In said closed loop, a fluid preferably circulates to distribute and transfer heat emanating from the interior electronic components 72 to the back pan 70.

The electronic components 72 illustrated are merely exemplary, any size, location, or number of components are contemplated. Said closed loop fluid may be air, preferably air that is free of particulate. Said closed loop may be further partitioned by a horizontal partition 65 and a vertical partition 55, which both preferably seal with the rear cover 25, when the rear cover 25 is placed atop the horizontal partition 65 and vertical partition 55. Said horizontal partition 65 and vertical partition 55 are preferably secured atop back pan 70 such that horizontal partition 65 adjoins vertical partition 55 perpendicularly and near an edge of horizontal partition 55.

As further illustrated in subsequent figures, the horizontal partition 65 and vertical partition 55 may be configured to partition the closed loop with select apertures in said partitions that permit and direct fluid flow through said apertures, thereby controlling and directing the circulation of the closed loop fluid. Any number of apertures are contemplated on both the horizontal partition 65 and the vertical partition 55. Fans 50 may be placed above select apertures to force the circulation of the closed loop fluids. Alternatively, the circulation may be accomplished by natural convection or quiescent flow. It is contemplated that any number of fans 50 may be used on any number of apertures on both the horizontal partition 65 and the vertical partition 55.

In the illustrated embodiment, the closed loop may primarily flow from an interior space below horizontal partition 65, via two fans 50 located atop apertures in the horizontal partition 65, and into an interior space above the horizontal partition 65, over the top edge of the vertical partition 55, down along a channel extending along the side of the vertical partition 55, and back into the interior space below the horizontal partition 65, thereby forming a continuous closed loop. While shown flowing in a clockwise direction here, embodiments could be counter-clockwise as well.

An open loop of fluid, such an ambient air, may be drawn into the bottom of the electronic display assembly 20 by fans 60 located at the bottom of the display. Alternatively, open loop fluid circulation may be accomplished by quiescent flow or natural convection. Any number of fans are contemplated. As will be explained in greater detail in subsequent figures, the fluid may then pass vertically through assembly 20 in an interior space between the back pan 70 and a rear surface of the backlight 75. The fluid may then be exhausted out the top of the assembly from a gap between the back pan 70 and the backlight 75 and outside the electronic display assembly 20 through aperture 22 between front cover 30 and rear cover 25 at the top of the electronic display assembly 20. The open loop may further comprise a filter, although not required, but could be located along the loop near the fans 60, to eliminate particulate from the circulating fluid, such as dust and moisture.

Figure 7:
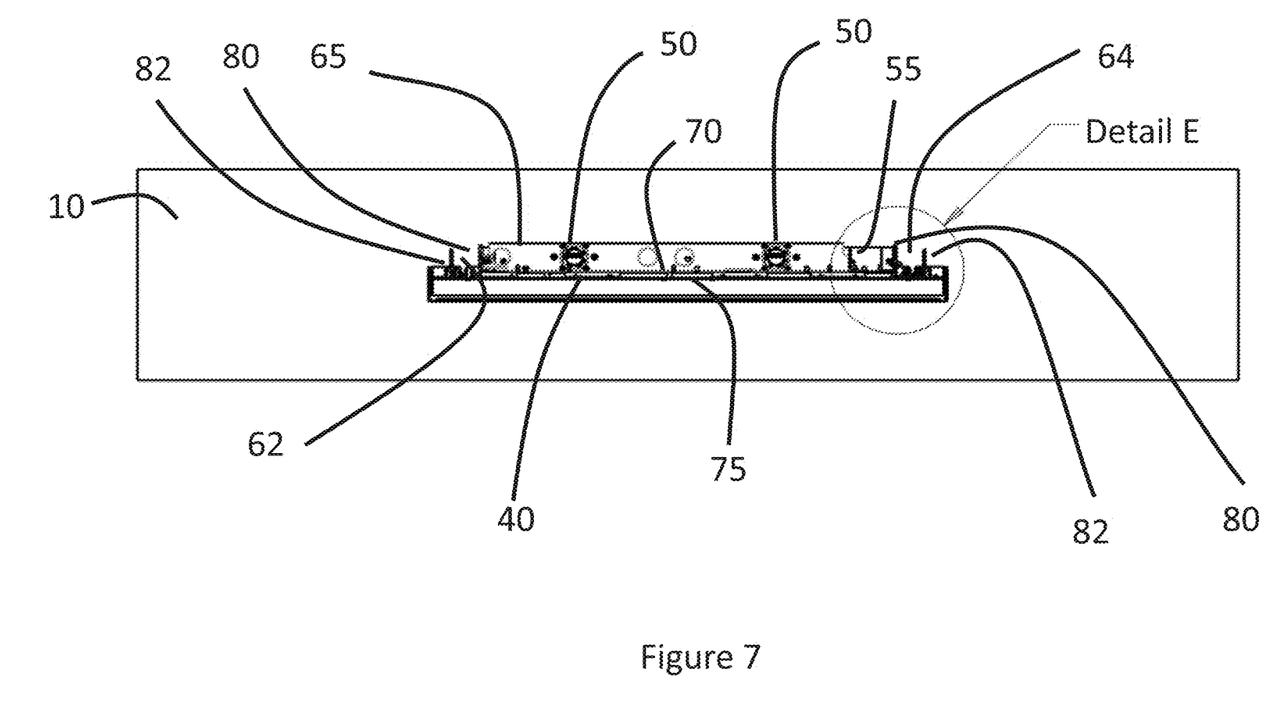
FIG. 7 is a cross sectional view of the assembly of FIG. 6 taken along section line A-A of and indicating Detail E.

Turning now to FIG. 7, the interior space defining the closed loop may be further defined by side walls 80, which preferably seal the closed loop when the rear cover 25 is in place to prevent ambient air, moisture, and particulate from entering the closed loop cavity. The horizontal partition 65 blocks a portion of the airflow in the closed loop such that the airflow is directed from a bottom chamber to a top chamber through the horizontal partition 65 via select apertures therein. The select apertures may additionally comprise fans 50 atop said apertures to direct and stimulate airflow. The closed loop airflow is further directed by vertical partition 55, which blocks a portion of the closed loop airflow and may direct said airflow through select apertures therein. The side channel extends from the lower to the upper chamber and completes the closed loop. Passageways 62 and 64 are defined by side walls 80 and exterior walls 82 on each respective side and permit the passage of elongate members 15, as is further detailed herein.

Figure 8:
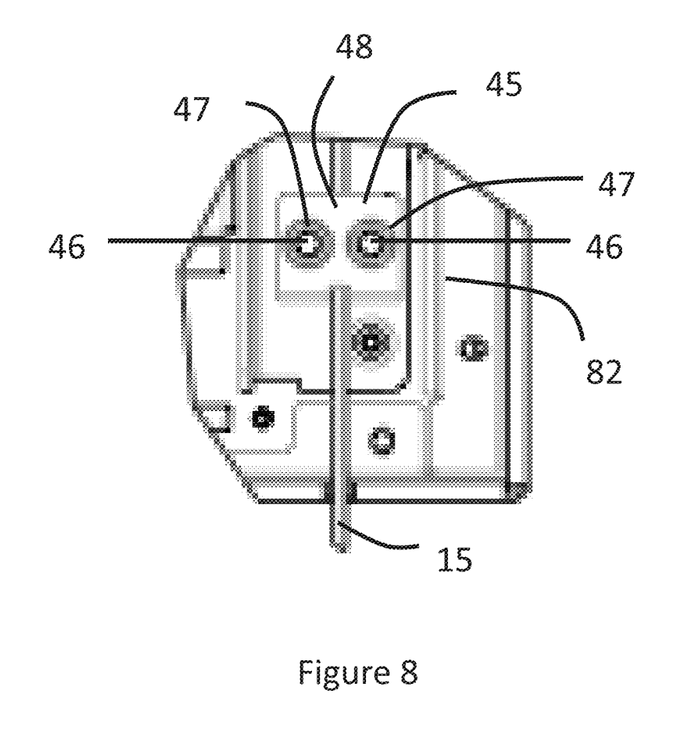
FIG. 8 is a rear detailed view of Detail D shown in FIG. 6.

FIG. 8 illustrates how the electronic display assembly 20 can be, optionally, suspended by elongate members 15 and secured by clamps 45. The elongate member 15 may run through passageways 62 and 64 located on the sides of the assembly, inside exterior walls 82, and be attached therein by clamps 45. Any number of clamps 45 are contemplated. Referring additionally to FIG. 1 and FIG. 6, preferably, in this embodiment, a pair of clamps 45 secure the elongate members 15 near the top of the assembly 20, another pair of clamps 45 secure the elongate members 15 at approximately the midpoint of the assembly 20, and a final pair of clamps 45 secure the elongate members 15 near the bottom of the assembly 20. In one embodiment, the clamps 45 comprise a plate 48 configured to accommodate the passage of elongate members 15 beneath and a pair of mounting apertures 47 passing through the plate. The mounting apertures 47 may permit a securing member, such as a threaded fastener 46, to pass through and be secured to the assembly 20 (when the fastener 46 and plate 48 draw against the front cover 25, rear cover 30, or the display 35). As the threaded fastener 46 is tightened, the clamps 45 may frictionally engage the elongate members 15 to secure the elongate members 15. The elongate members 15 may be made of a suitably high tensile strength material, such as metallic cable or wire rope. The clamps 45 may be made of a suitably strong material, such as a metal, polymer, or composite.

Figure 9:
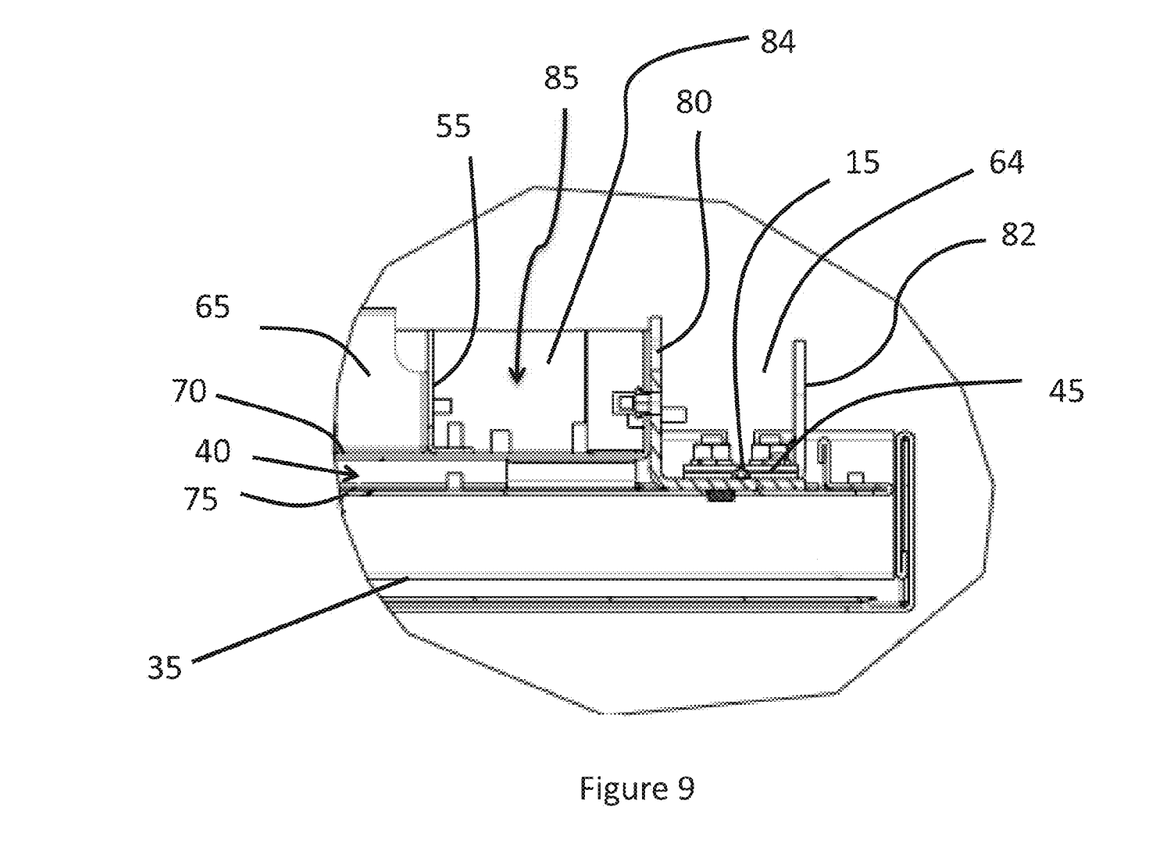
FIG. 9 is a detailed section view of Detail E shown in FIG. 7.

FIG. 9 The open loop may be defined by a channel, indicated generally at 40, extending between the back pan 70 and the backlight 75. Said channel 40 extends substantially vertically between the top and bottom of the electronic display assembly 20. The closed loop may be defined by the space defined between the back pan 70, rear cover 25, and on the sides by side walls 80 which may surround the sealed compartment 84. The horizontal partition 65 preferably lies atop the back pan 70 and is preferably oriented substantially perpendicular to the back pan 70. Vertical partition 55 may extend substantially perpendicular to and adjoins a side of horizontal partition 65. Side wall 80 preferably seals and encloses the sealed compartment 84. The side channel, indicated generally at 85, is defined by the space between vertical partition 55 and side wall 80. As previously illustrated, elongate member 15 extends through the electronic display assembly 20 via passageway 64 defined by the space between side walls 80 and exterior walls 82, and is secured therein by clamps 45.

Figure 10:
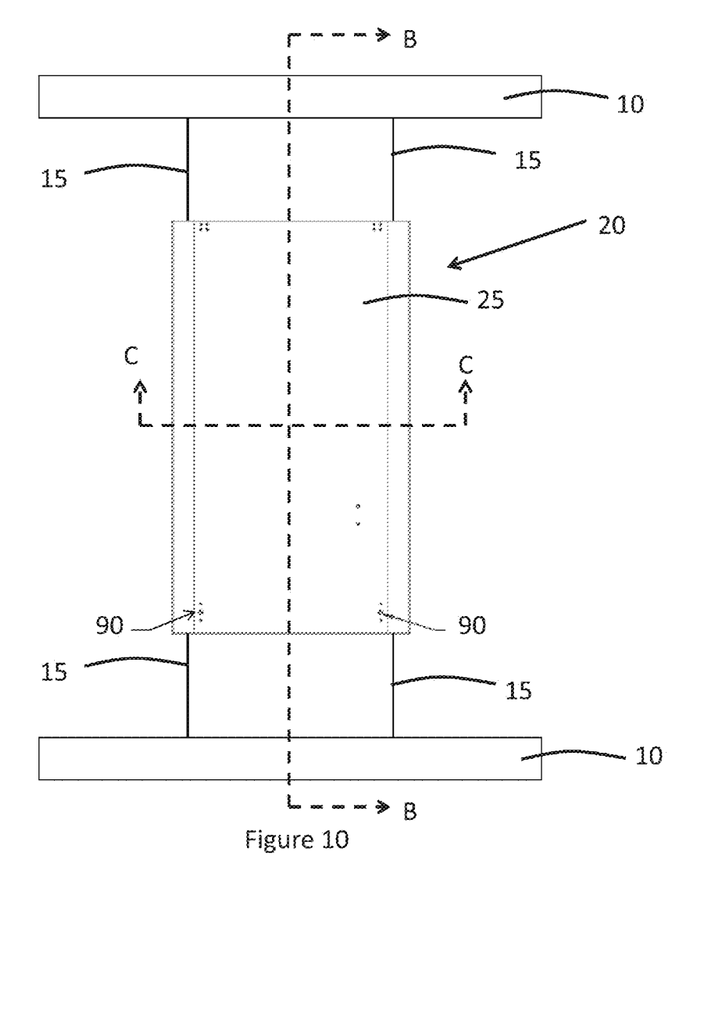
FIG. 10 is a rear planar view of the assembly of FIG. 1, illustrated with the rear cover in place and indicating section lines B-B and C-C.
Figure 11:
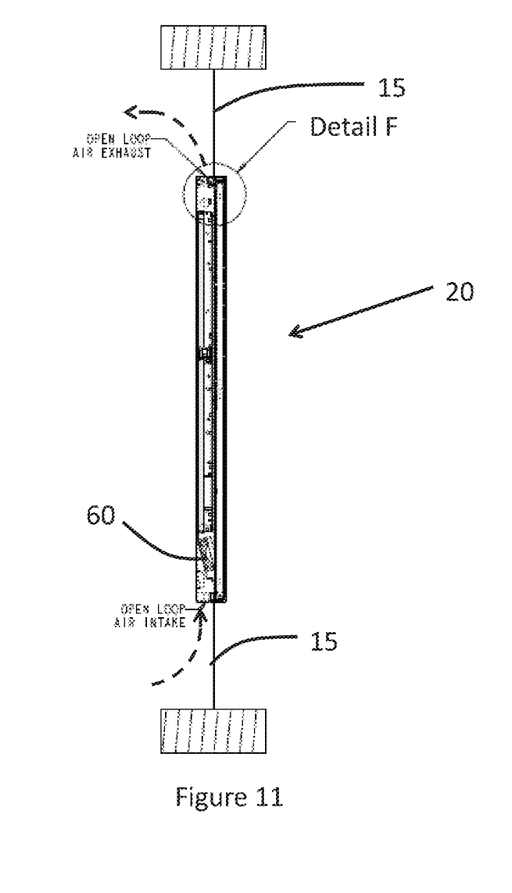
FIG. 11 is a cross sectional view of the assembly of FIG. 10 taken along section line B-B of and indicating Detail F.

FIG. 10 is substantially the same as FIG. 6 with the rear cover 25 in place. FIG. 10 illustrates a rear view of the electronic display assembly with the rear cover 25 in place. The rear cover 25 covers substantially the entirety of the rear of the electronic display assembly 20. The elongate members 15 preferably extend from the supports 10 through the electronic display assembly 20. The rear cover 25 is secured in place by a securing mechanism, such as spring locks 90. Alternatively, other securing mechanisms such as threaded fasteners, pins, hooks, slots, and the like may be used to secure rear cover 25 in place.

Elongate member 15 preferably passes through the entirety of the electronic display assembly 20. Alternatively, multiple elongate members 15 may be utilized which terminate within the electronic display assembly 20.

Figure 12:
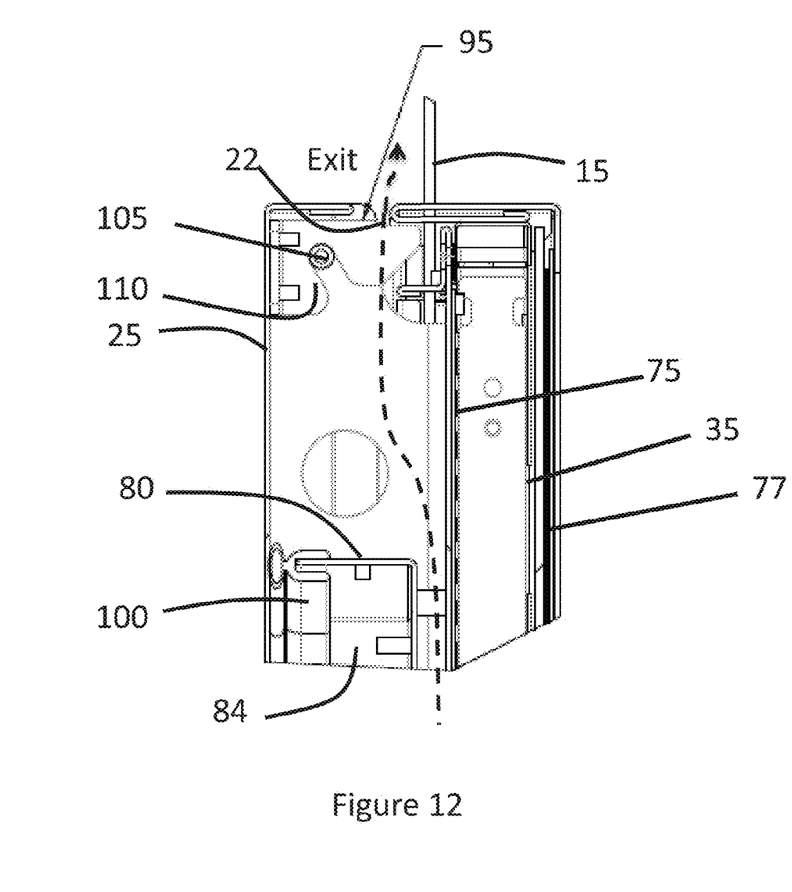
FIG. 12 is a detailed view of Detail F shown in FIG. 11.

Referring additionally now to FIG. 12, the open loop exhaust can be seen exiting the top of the electronic display assembly via aperture 22. Hook bracket 95 is secured to rear cover 25. The hook bracket 95 contains an accommodating slot 110 that accommodates a side rail 105, thereby securing the rear cover 25 in place. Any bracket configuration and accommodating slot design is contemplated. Alternatively, other securing mechanisms such as threaded fasteners, pins, or the like are contemplated.

The rear cover 25, in part, defines the rear wall of the sealed compartment 84, as previously explained. The rear cover 25 may comprise a closed loop gasket 100, which is preferably sandwiched between the side wall 80 and the rear cover 25. The closed loop gasket 100 may be sandwiched between the side wall 80 and the bottom surface of rear cover 25, thereby preferably creating an air-tight seal. The closed loop gasket 100 may be comprised of rubber, silicone, a polymer, or compounds thereof. Alternatively, any other suitably flexible and impermeable material may be utilized. The shape of the illustrated closed loop gasket 100 is merely exemplary, other known gasket shapes and designs are contemplated. Alternatively, the side walls 80 may have an integrated gasket. Further still, the side wall 80 may extend to the bottom surface of the rear cover 25 with a possible interference fit, thereby sealing the closed loop and no gasket is required. Some embodiments may place a protective transparent plate 77 in front of the display 35, which could be glass, plastic, or a composite material.

Figure 13:
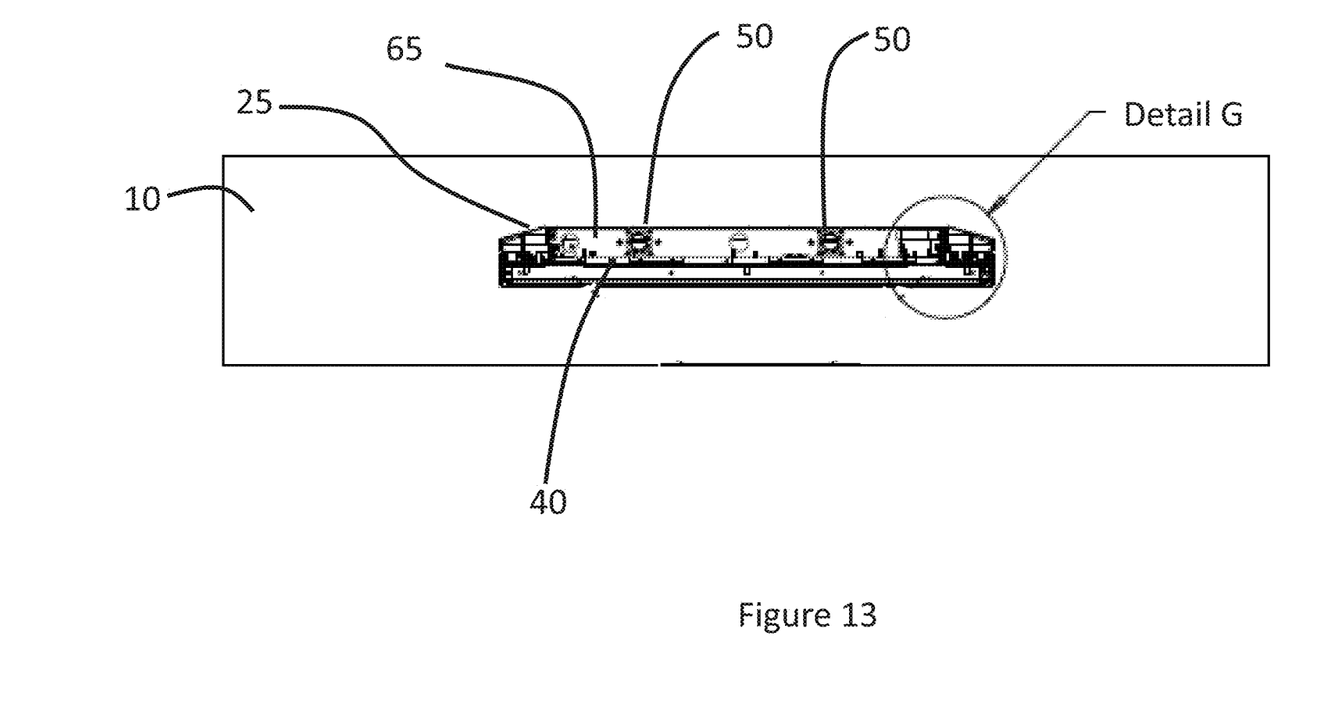
FIG. 13 is a cross sectional view of the assembly of FIG. 10 taken along section line CC of and indicating Detail G.

FIG. 13 is substantially similar to FIG. 7, except the rear cover 25 is in place, which preferably covers substantially the entirety of the rear of the assembly.

Figure 14:
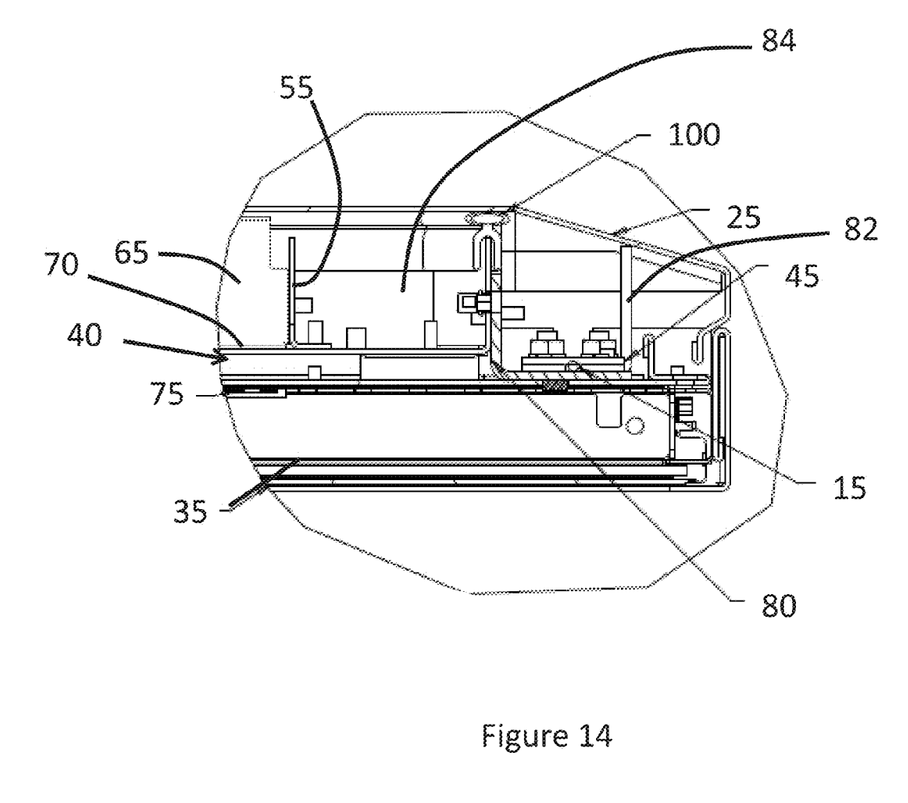
FIG. 14 is a detailed view of Detail G shown in FIG. 13.

FIG. 14 is substantially similar to FIG. 9, except the rear cover 25 is in place and may further define the sealed compartment 84. Closed loop gasket 100, if used, preferably extends between the top edge of side wall 80 and the front surface of the rear cover 25, thereby creating an air-tight seal, further defining the closed loop.

It should also be noted that the variety of open and closed cooling loops that are shown in the figures may be shown in a horizontal or vertical arrangement but it is clearly contemplated that this can be reversed or changed depending on the particular embodiment. Thus, the closed loop may run horizontally or vertically and in a clockwise or counter-clockwise direction. Further, the open loop may also be horizontal or vertical and can run left to right, right to left, and top to bottom, or bottom to top.

The display 35 can be any type of electronic display, but is preferably a flat panel electronic display. An exemplary embodiment may include a liquid crystal display as the display 35 and preferably would be a direct LED backlit LCD display, but could also be an OLED, plasma, or electroluminescent polymer.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

We claim:

1. An electronic display assembly for suspending an electronic display from a pair of elongate members comprising:
    a back pan positioned behind the electronic display and having a perimeter;
    a dividing wall positioned around the perimeter of the back pan;
    a rear cover placed atop the dividing wall to define a sealed compartment comprising the back pan, dividing wall, and rear cover;
    a pair of passageways travelling vertically and outside of the sealed compartment; and
    at least one clamp within each passageway sized to accept an elongate member.

2. The electronic display assembly of claim 1 further comprising:
    a fan placed within the sealed compartment.

3. The electronic display assembly of claim 1 further comprising:
    a horizontal partition within the sealed compartment.

4. The electronic display assembly of claim 1 further comprising:
    a vertical partition within the sealed compartment.

5. The electronic display assembly of claim 1 further comprising:
   a channel defined between a rear surface of the electronic display and a front surface of the back pan.

6. The electronic display assembly of claim 5 further comprising:
   a fan placed to draw ambient air through the channel.

7. The electronic display assembly of claim 1 wherein:
   the passageways are vertical and parallel to vertical portions of the dividing wall.

8. An electronic display assembly for suspending an electronic display from a pair of elongate members comprising:
   a back pan positioned behind the electronic display and having a perimeter;
   a sealed electronics compartment comprising the back pan, a dividing wall having vertical and horizontal portions, and a rear cover;
   a first and second outside wall running vertically and substantially parallel to the vertical portions of the dividing wall and outside the sealed electronics compartment;
   a first clamp sized for an elongate member and placed between the first outside edge and a vertical portion of the dividing wall; and
   a second clamp sized for an elongate member and placed between the second outside edge and a vertical portion of the dividing wall.

9. The electronic display assembly of claim 8, the sealed electronics compartment further comprising:
   a barrier wall oriented horizontally.

10. The electronic display assembly of claim 9, the sealed electronics compartment further comprising:
    a second barrier wall oriented vertically.

11. The electronic display assembly of claim 8 further comprising:
    a fan placed within the sealed electronics compartment.

12. The electronic display assembly of claim 8 further comprising:
    a channel defined between a rear surface of the electronic display and a front surface of the back pan.

13. The electronic display assembly of claim 12 further comprising:
    a fan placed to draw ambient air through the channel.

14. The electronic display assembly of claim 13 further comprising:
    a filter for removing moisture and particulate from the ambient air.

15. An electronic display assembly for suspending an electronic display from a pair of elongate members comprising:
    a back pan positioned behind the electronic display to define a channel between the back pan and the electronic display;
    a front cover and rear cover positioned to substantially surround the electronic display and the back pan;
    a fan positioned to draw ambient air through the channel;
    a first vertical passageway defined between the front and rear cover and sized to accept an elongate member travelling the entire length of the front and rear cover;
    a second vertical passageway defined between the front and rear cover and sized to accept an elongate member travelling the entire length of the front and rear cover.

16. The electronic display assembly of claim 15 wherein:
    the first and second vertical passageways are placed outside of the channel.

17. The electronic display assembly of claim 15 further comprising:
    a clamp configured to accept the elongate member.

18. The electronic display assembly of claim 15 further comprising:
    a sealed chamber defined by the back pan, the first vertical passage, the second vertical passage, and the rear cover.

19. The electronic display assembly of claim 18 further comprising:
    a substantially horizontal partition and substantially vertical partition placed within the sealed chamber.

20. The electronic display assembly of claim 18 further comprising:
    a fan placed within the sealed chamber.

* * * * *